(12) United States Patent
Kim et al.

(10) Patent No.: US 6,432,746 B2
(45) Date of Patent: Aug. 13, 2002

(54) METHOD FOR MANUFACTURING A CHIP SCALE PACKAGE HAVING SLITS FORMED ON A SUBSTRATE

(75) Inventors: Shin Kim; Hee-Guk Choi; Se Ill Kim, all of Chungcheongnam-do; Se Yong Oh, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/840,725

(22) Filed: Apr. 23, 2001

(30) Foreign Application Priority Data

Jun. 20, 2000 (KR) .............................. 00-33815

(51) Int. Cl.⁷ .............................................. H01L 21/44
(52) U.S. Cl. ...................... 438/117; 438/106; 438/127
(58) Field of Search ................................ 438/106, 117, 438/125, 126, 127, 112, 124

(56) References Cited

U.S. PATENT DOCUMENTS

| | | | | |
|---|---|---|---|---|
| 5,831,833 A | * | 11/1998 | Shirakawa et al. | 361/762 |
| 5,999,413 A | * | 12/1999 | Ohuchi et al. | 361/772 |
| 6,091,140 A | * | 7/2000 | Toh et al. | 257/691 |
| 6,093,970 A | * | 7/2000 | Ohsawa et al. | 257/777 |
| 6,210,992 B1 | * | 4/2001 | Tandy et al. | 438/106 |
| 6,291,884 B1 | * | 9/2001 | Glenn et al. | 257/747 |
| 6,300,165 B2 | * | 10/2001 | Castro | 438/118 |
| 6,319,749 B1 | * | 11/2001 | Shigeta et al. | 438/106 |

FOREIGN PATENT DOCUMENTS

| | | |
|---|---|---|
| KR | 1999-001899 A | 1/1999 |
| KR | 1999-0191076 B | 6/1999 |

OTHER PUBLICATIONS

English abstract of Korean Patent No. 1999–0191076B.
English abstract of Korean Patent No. 1999–001899A.

* cited by examiner

*Primary Examiner*—Michael J. Sherry
*Assistant Examiner*—Scott Geyer
(74) *Attorney, Agent, or Firm*—Marger Johnson & McCollo, P.C.

(57) ABSTRACT

A method for manufacturing a chip scale package (CSP) including a semiconductor chip and conductive bumps is disclosed. In the present invention, a flexible substrate is provided with a conductive pattern formed thereon. The substrate has a top surface and a bottom surface. Then, a first photosensitive resin pattern is formed over the top surface of the substrate. Next, the first photosensitive resin pattern is cured. Subsequently, a second photosensitive resin pattern is formed over the cured first photosensitive resin pattern. The second photosensitive resin pattern includes a slit comprising a bottom of the first photosensitive resin pattern and side walls of the second photosensitive resin pattern. With the present invention, the problem of burning of neighboring patterns as well as the problem of the overflow of the encapsulant can be overcome.

20 Claims, 5 Drawing Sheets

METHOD FOR MANUFACTURING A CHIP SCALE PACKAGE HAVING SLITS FORMED ON A SUBSTRATE

BACKGROUND OF THE INVENTION

1. Technical Field of the Invention

This invention relates to a semiconductor packaging technology, and in particular to a method for manufacturing chip scale packages.

2. Description of Related Art

It has long been desired to produce semiconductor chips that are lighter, smaller, and having higher speed, multi-function and improved reliability at low costs. Various packaging technologies have been developed to address these needs. For example, a ball grid array (BGA) package provides a relatively high surface-mount density and improved electrical performance as compared to conventional plastic packages having a metal lead frame.

The BGA package is different from a conventional plastic package in that the electrical connection between the semiconductor chip and the main board is provided by a substrate including multiple layers with circuit patterns instead of the lead frame of the plastic packages. In the BGA package, the semiconductor chip is attached and electrically connected to a substrate having vias that interconnect electrically conductive traces on the top of the substrate where the chip is attached to terminals on the bottom of the substrate opposite the chip. The terminals on the bottom of the substrate can be provided in an array pattern so that the area occupied by the BGA package on a main board is smaller than that of the conventional plastic package with peripheral terminals.

The substrate used in the BGA package, however, may still be larger than the semiconductor chip because an area without conductive traces may be required when attaching the chip to the substrate. A further reduction in the size of the BGA package may thus be limited. In response, the further size reduction of semiconductor chip packages have been provided by a chip scale package (CSP, also referred to as 'chip size package').

In recent years, various CSP models have been introduced by several semiconductor manufacturers in the USA, Japan and Korea, and the development for the new form of the CSP is under way. Among them, the micro-BGA ($\mu$BGA) is a representative chip scale package developed by Tessera. The micro-BGA employs a tape-wiring substrate such as a thin flexible circuit board. One of the characteristics of the micro-BGA is that beam leads are bonded to bond pads of the semiconductor chip through a window formed in the tape-wiring substrate all at the same time.

However, as the semiconductor chip scales further down, it has become more difficult for the micro-BGA to accommodate fine pitch and arrangement of the bond pads in two rows. In response to these problems, a wire-bonding-type CSP has been introduced. The wire-bonding-type CSP applies a wire-bonding technology to ensure reliability of the CSP by replacing beam lead bonding of the micro-BGA with the wire bonding. The wire-bonding-type BGA can be manufactured through the same process, except for wire bonding and plasma cleaning steps.

FIG. 1 shows a cross-sectional view of conventional wire-bonding-type chip scale package.

To an active surface of a semiconductor chip 10, a substrate 40 is attached by a non-conductive adhesive 30. On the surface of the substrate 40 is formed a wiring pattern 50, which may be of copper. A photosensitive resin layer 60 is deposited and patterned. The photosensitive resin layer 60 is used to prevent the neighboring patterns from being short-circuited and burnt during test processes such as a THB (thermal humidity bias) test. Each solder ball 70 is bonded to a corresponding solder ball land 55, which is formed by patterning the wiring pattern 50 and the photosensitive resin layer 60. Bonding wires 80 electrically connect the semiconductor chip 10 and the wiring pattern 50. Thereafter, the bonding wire areas of the semiconductor 10 are encapsulated with an encapsulant 90.

However, in the conventional wire-bonding-type CSP 100, the loop height of the bonding wire 80 is higher than that of the photosensitive resin layer 60. Therefore, the encapsulant 90 rises above the top surface of the photosensitive resin layer 60. This results in an overflow of the encapsulant 90 into the solder ball land 55, although not shown in FIG. 1. If this happens, before the solder balls 70 are attached to the solder ball lands 55, the overflowed encapsulant 90 can be stuck to the attached solder balls 70. This weakens the bonding between the solder balls 70 and the solder ball lands 55. At worst, this may result in physical detachment of the solder balls 70 from the solder ball lands 55. Also, an electrical resistance in the solder joint can be increased and testing of the CSP can fail when test pins are repeatedly closed and opened to pick and release the solder balls 70 contaminated with the overflowed encapsulant 90.

SUMMARY OF THE INVENTION

Accordingly, it is an object of this invention to provide a method for manufacturing a chip scale package having a structure capable of preventing an overflow of an encapsulant.

It is another object of this invention to provide a method for manufacturing a chip scale package, which can overcome the problem of burning of neighboring patterns.

According to one aspect of this invention, a method for manufacturing a chip scale package (CSP) including a semiconductor chip and conductive bumps is disclosed. In one embodiment of the present invention, a flexible substrate is provided with a conductive pattern formed thereon. The substrate has a top surface and a bottom surface. Then, a first photosensitive resin pattern is formed over the top surface of the substrate. Next, the first photosensitive resin pattern is cured. Subsequently, a second photosensitive resin pattern is formed over the cured first photosensitive resin pattern. The second photosensitive resin pattern includes a slit comprising a bottom of the first photosensitive resin pattern and side walls of the second photosensitive resin pattern.

These and other features, and advantages, will be more clearly understood from the following detailed description taken in conjunction with the accompanying drawings. It is important to point out that the illustrations may not necessarily be drawn to scale, and that there may be other embodiments of this invention, which are not specifically illustrated.

BRIEF DESCRIPTION OF THE INVENTION

DETAILED DESCRIPTION OF PREFERRED EMBODIMENTS

FIGS. 2a through 2h are cross-sectional views for illustrating the manufacturing process of a chip scale package according to the present invention.

Figure 2A:
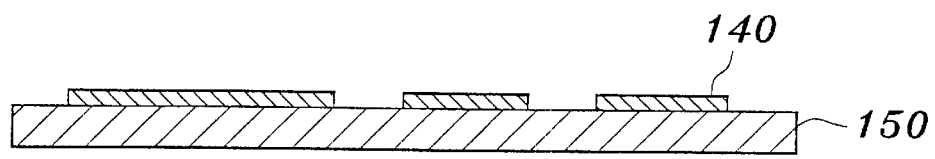
FIGS. 2a through 2h are cross-sectional views of a chip scale package according to this invention and illustrate the flow of the invented manufacturing process thereof.
Figure 2B:
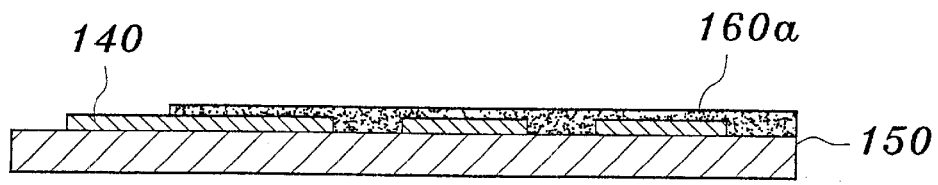

As shown in FIG. 2a, a substrate 150 of the present invention preferably comprises a polyimide tape on which conductive wiring patterns 140 are formed. The substrate 150 may be flexible and provides a base structure to which a semiconductor chip is attached. Any other suitable material other than polyimide can be used for the substrate 150 within the spirit and scope of the present invention. The conductive wiring patterns 140 can be formed of metal, typically copper. Over a portion of the top of the substrate 150, a first photosensitive resin layer 160a is deposited, as shown in FIG. 2b. The first photosensitive resin layer 160a has a thickness of at least approximately 3 $\mu$m, e.g. approximately 10 $\mu$m. The photosensitive resin layer 160a may be a PSR4000 series available from Tao Ink in Japan, or any other suitable resin.

Figure 2C:
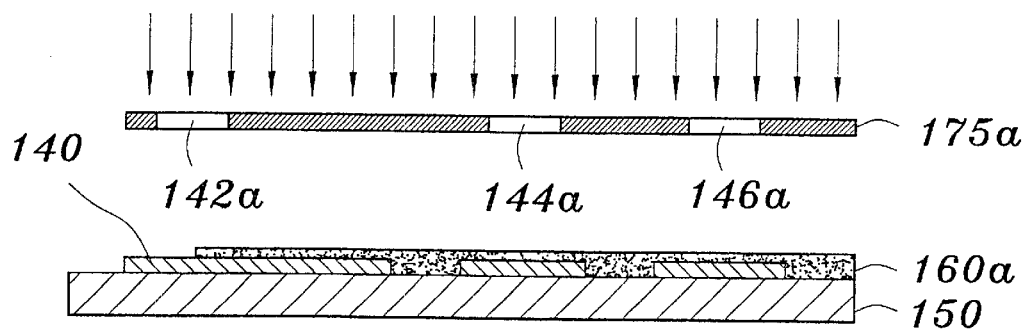
Figure 2D:
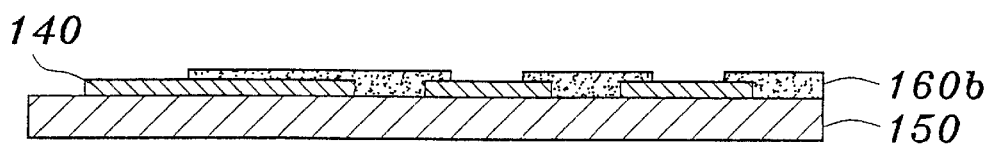

In FIG. 2c, the substrate 150 is exposed by using a mask 175a in which a bonding finger region 142a and solder ball land regions 144a and 146a are defined. The bonding finger region 142a defines where bonding wires are bonded, while the solder ball land regions 144a and 146a define where solder balls are bonded. The first photosensitive resin pattern 160b is obtained by developing and etching the exposed first photosensitive resin layer 160a, as shown in FIG. 2d. This first photosensitive resin pattern 160b is cured at high temperature, for example at 150 degrees Celsius.

Figure 2E:
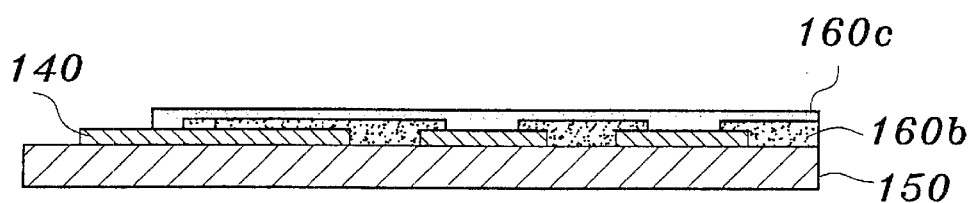

Now referring to FIG. 2e, a second photosensitive resin 160c is further deposited on the cured first photosensitive resin pattern 160b. The second photosensitive resin 160c has a thickness of at least approximately 7 $\mu$m, e.g. approximately 20 $\mu$m.

Figure 2F:
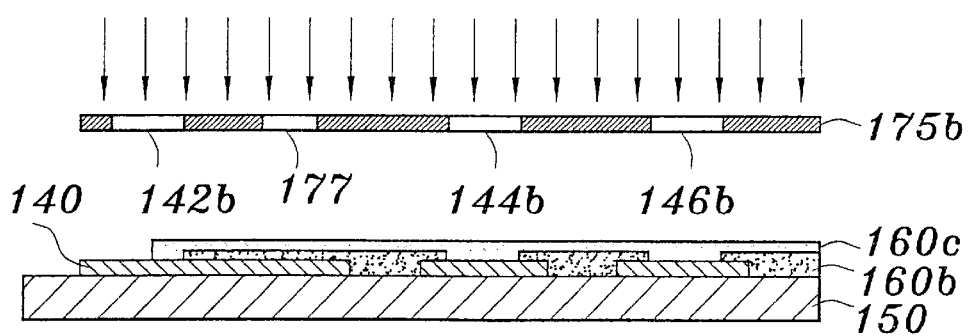

In FIG. 2f, the second photosensitive resin 160c is exposed by using a mask 175b in which a bonding finger region 142b, solder ball land regions 144b and 146b and a slit region 177 are formed.

Figure 2G:
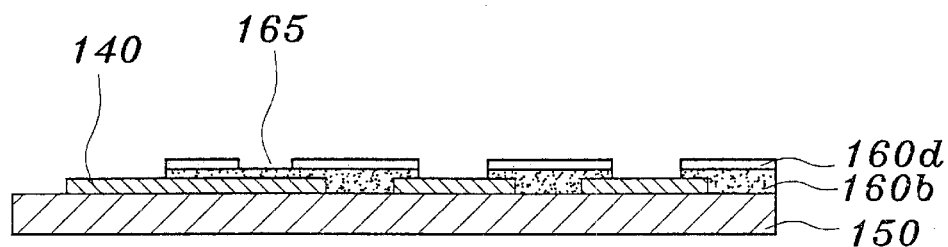

The second photosensitive resin layer 160c is then developed and etched to form a second photosensitive resin pattern 160d as shown in FIG. 2g. In this pattern formation step, a slit 165 is formed. The slit 165 comprises a bottom made of the first photosensitive resin pattern 160b and side walls made of the second photosensitive resin pattern 160d. Further, the slit 165 has a recess having a predetermined depth from the top surface of the second photosensitive resin pattern 160d. The predetermined depth of the recess corresponds to the thickness of the second photosensitive resin pattern 160d, for example, approximately 20 $\mu$m. A portion of the first photosensitive resin pattern 160b which remains in the slit region 165 was cured in the step of FIG. 2d, and therefore has not been removed during etching of the second photosensitive resin layer 160c.

Figure 2H:
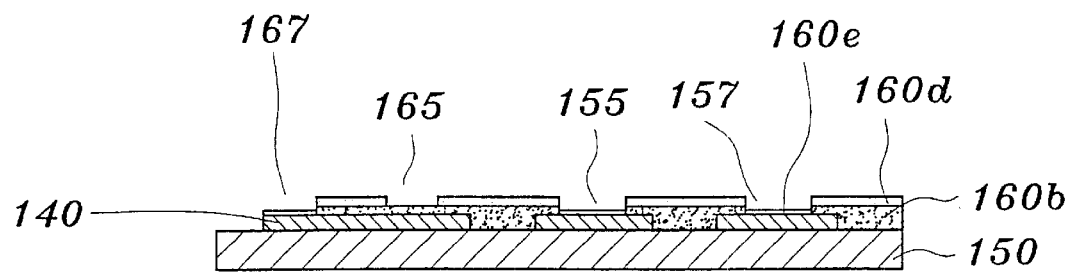

Finally, as shown in FIG. 2h, a conductive layer 160e of e.g., nickel/gold compound metal layer is deposited onto the bonding finger region 167 and the solder ball land regions 155 and 157 as a solder ball land or an under bump metallurgy layer or the like for electrical interconnection and/or mechanical support.

According to the present invention, then the substrate 150 for a chip scale package has slits on its top surface, which can prevent overflow of an encapsulating material.

Moreover, except for the bonding finger region 167, there is no exposed wiring pattern 140 on the top surface of the substrate. Therefore, the burnt problem of neighboring patterns does not occur during the thermal humidity bias (THB) test. The THB test is a form of reliability test performed in a high temperature environment, e.g. of 85 Celsius degrees and humidity of e.g., 85% while the semiconductor chip is biased to be in an operational state. If moisture penetrates into the copper patterns 140 during the THB test, the copper may corrode and/or melt to flow out, resulting in short circuits to neighboring copper patterns, thereby burning a portion of the copper patterns 140 black.

However, with the present invention, the burning of the copper patterns does not occur, because the slits are formed on the substrate 150 such that the copper pattern is covered with the photosensitive resin layer which comprises the bottom surface of the slit.

Figure 1:
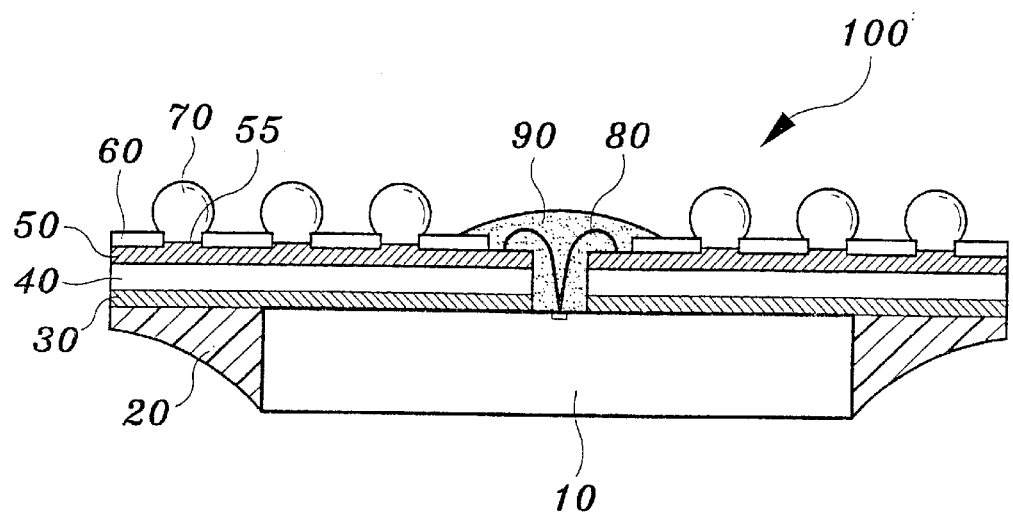
FIG. 1 is a cross-sectional view of a conventional wire-bonding-type chip scale package.
Figure 3:
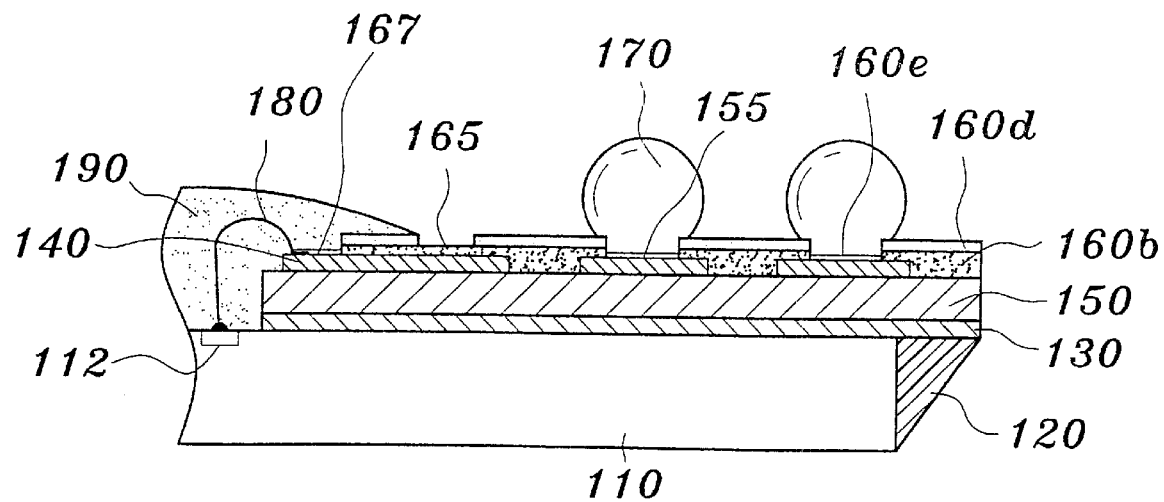
FIG. 3 is a partial cross-sectional view of a chip scale package according to this invention.
Figure 4:
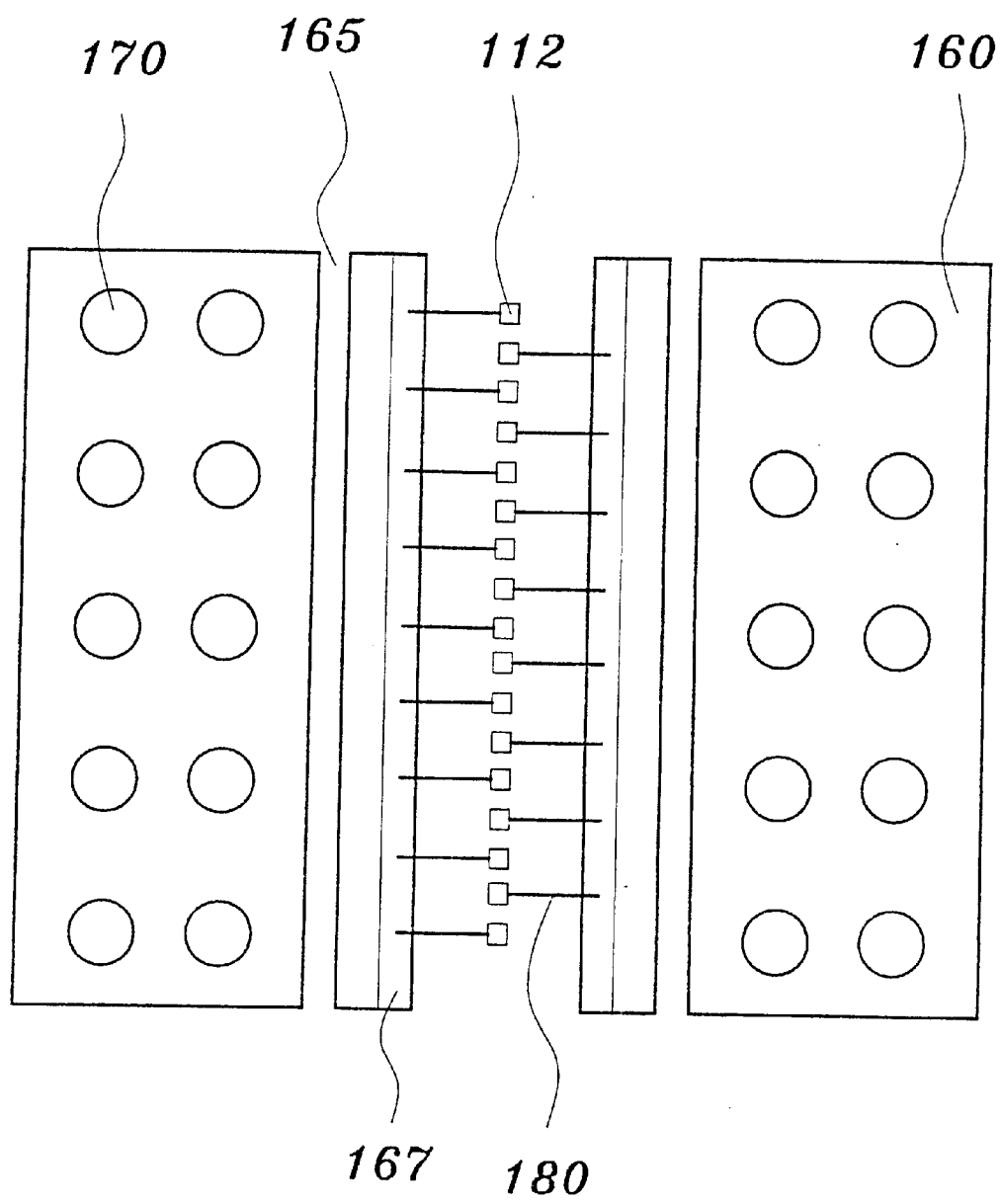
FIG. 4 is a plan top view of a chip scale package according to this invention.

FIG. 3 is a partial cross-sectional view of a chip scale package according to one embodiment the present invention, and FIG. 4 is a top plan view of a chip scale package according to one embodiment of the present invention.

Referring to FIG. 3, a substrate 150 is attached to an active surface (i.e., on which circuit elements are formed) of a semiconductor chip 110 using a nonconductive adhesive 130. The non-conductive adhesive 130 is preferably formed of an elastic material.

The first and second photosensitive resin patterns 160b, 160d are formed overlying the conductive wiring patterns 140. Also, solder balls 170 are bonded to corresponding solder ball lands 155. The solder balls 170 electrically connect the semiconductor chip 110 with various external devices (not shown). The solder balls 170 are connected to bond pads 112 of the semiconductor chip 110 via the copper wiring patterns 140 and one or more bonding wires such as wire 180. The semiconductor chip 110 and the conductive wiring patterns 140 are electrically connected by bonding metal wires 180 to both a bonding finger region 167 and the bond pads 112. The semiconductor chip 110 is encapsulated with an encapsulant 120, e.g. an epoxy molding compound, and a region where the wires 180 are bonded also is covered with an encapsulant 190.

As shown in FIG. 3, the overflow of the encapsulant 190 can be prevented using a slit 165 comprising the bottom made of the first photosensitive resin pattern 160b and the side walls made of the second photosensitive resin pattern 160d.

Generally, the height of the loop of the bonding wire 180 in the bonding finger region 167 is approximately 60 to 80 $\mu$m. However, because the combined thickness of the photosensitive resin patterns 160b, 160d is approximately 30 $\mu$m as described with reference to FIG. 2, the height of the encapsulant 190 for covering the bonding wire 180 is inevitably greater than the height of the top surface of the second photosensitive resin pattern 160d. This can result in the overflow of the encapsulant 190 onto the second photosensitive resin 160.

Therefore, a solution to such an overflow problem has been needed. A printing technique may be used for depositing the encapsulant 190. However, the printing technique has some drawbacks in that it requires expensive equipment and labors.

In accordance with the present inventive structure having a slit between the bond finger region 167 and the solder ball land 155, the overflow problem of the encapsulant or mold resin can be solved without using an expensive printing technique. The flow of the encapsulant approximately stops at the slit 165 and does not fill the slit 165, because of the surface tension of the encapsulant 190. Therefore, the bottom surface of the slit 165 is exposed without being covered with the encapsulant 190. Because the bottom surface of the slit 165 is exposed, curing of the first photosensitive resin pattern 160d illustrated in the step of FIG. 2d is important.

As shown in FIG. 4, the slit 165 of the present invention splits divides the photosensitive resin patterns 160b, 160d in a direction parallel to the direction along which bond pads 112 are arranged. Thus, an overflow of the encapsulant into the solder ball land region 155 can be prevented.

In the drawings and specification, there have been disclosed typical preferred embodiments of this invention and, although specific terms are employed, they are used in a generic and descriptive sense only and not for purposes of limitation, the scope of this invention being set forth in the following claims.

What we claim:

1. A method for manufacturing a chip scale package (CSP) including a semiconductor chip and conductive bumps, comprising:
    providing a flexible substrate with a conductive pattern formed thereon, the substrate having a top surface and a bottom surface;
    forming a first photosensitive resin pattern over the top surface of the substrate;
    curing the first photosensitive resin pattern; and
    forming a second photosensitive resin pattern over the cured first photosensitive resin pattern, the second photosensitive resin pattern including a slit comprising a bottom of the first photosensitive resin pattern and side walls of the second photosensitive resin pattern; the first and second photosensitive resin patterns having an opening therein to expose the conductive pattern for electrical interconnection.

2. The method as claimed in claim 1, further comprising depositing a conductive layer overlying the exposed conductive pattern for interconnecting the chip and the conductive bumps.

3. A method as claimed in claim 2, further comprising:
    attaching the semiconductor chip onto the bottom surface of the substrate, so that an active surface of the semiconductor chip is partially exposed from the substrate;
    electrically interconnecting the semiconductor chip and the conductive pattern; and
    encapsulating a portion of the exposed active surface of the semiconductor chip.

4. The method as claimed in claim 3, wherein the electrical interconnection is made by bonding wires.

5. The method as claimed in claim 3, wherein the semiconductor chip comprises a plurality of bond pads electrically connected to the bonding wires, and the slit is longitudinally oriented in a direction parallel to the direction along which the plurality of bond pads are arranged.

6. The method as claimed in claim 1, wherein the first photosensitive resin layer has a thickness of at least approximately 3 $\mu$m and the second photosensitive resin layer has a thickness of at least approximately 7 $\mu$m.

7. The method as claimed in claim 1, wherein the first photosensitive resin layer has a thickness of approximately 10 $\mu$m and the second photosensitive resin layer has a thickness of approximately 20 $\mu$m.

8. The method as claimed in claim 1, wherein the flexible substrate is formed of polyimide.

9. The method as claimed in claim 1, wherein said forming the first photosensitive resin pattern comprises:
    forming a first photosensitive resin layer, exposing, developing and etching the deposited first photoresist resin layer.

10. A method as claimed in claim 3, wherein the first photosensitive resin layer has a thickness of at least approximately 3 $\mu$m and the second photosensitive resin layer has a thickness of at least approximately 7 $\mu$m.

11. A method as claimed in claim 3, wherein the first photosensitive resin layer has a thickness of approximately 10 $\mu$m and the second photosensitive resin layer has a thickness of approximately 20 $\mu$m.

12. The method as claimed in claim 1, wherein, in said step of curing the first photosensitive resin pattern, the curing temperature is set to be approximately 150 Celsius degrees.

13. The method as claimed in claim 3, wherein, in said step of curing the first photosensitive resin pattern, the curing temperature is set to be approximately 150 degrees Celsius.

14. A method for manufacturing a chip scale package (CSP) including a semiconductor chip and conductive bumps, comprising:
    providing a flexible substrate with a conductive pattern formed thereon, the substrate having a top surface and a bottom surface;
    forming a photosensitive resin pattern over the top surface of the substrate, the photosensitive resin pattern including an encapsulant-overflow-resistant gap comprising a bottom and side walls of the photosensitive resin pattern; the photosensitive resin pattern having an opening therein to expose the conductive pattern for electrical interconnection.

15. The method as claimed in claim 14, further comprising depositing a conductive layer overlying the exposed conductive pattern for interconnecting the chip and the conductive bumps.

16. A method as claimed in claim 14, further comprising:
    attaching the semiconductor chip onto the bottom surface of the substrate, so that an active surface of the semiconductor chip is partially exposed from the substrate;
    electrically interconnecting the semiconductor chip and the conductive pattern; and
    encapsulating a portion of the exposed active surface of the semiconductor chip.

17. The method as claimed in claim 16, wherein the electrical interconnection is made by bonding wires.

18. The method as claimed in claim 16, wherein the semiconductor chip comprises a plurality of bond pads electrically connected to the bonding wires, and the encapsulant-overflow-resistant gap is longitudinally oriented in a direction parallel to the direction along which the plurality of bond pads are arranged.

19. The method as claimed in claim 18, wherein the gap is provided between the plurality of bond pads and the conductive bumps.

20. The method as claimed in claim 14, wherein the bottom of the photoresist pattern is cured.

* * * * *